(12) United States Patent
Andersen et al.

(10) Patent No.: US 8,270,154 B2
(45) Date of Patent: Sep. 18, 2012

(54) SELF-CONTAINED AND MODULAR AIR-COOLED CONTAINERIZED SERVER COOLING

(75) Inventors: Brian Clark Andersen, Kent, WA (US); Cheerei Cheng, Newcastle, WA (US); Daniel G. Costello, Redmond, WA (US); Steven Solomon, Arizona, AZ (US); Christian L. Belady, Mercer Island, WA (US); Jens Housley, Hillsboro, OR (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 12/360,188

(22) Filed: Jan. 27, 2009

(65) Prior Publication Data

US 2010/0188810 A1 Jul. 29, 2010

(51) Int. Cl.
*G06F 1/20* (2006.01)
*H05K 7/20* (2006.01)

(52) U.S. Cl. ......... 361/679.47; 361/679.48; 361/679.49; 361/679.51; 361/679.53; 361/679.54; 361/695; 361/696; 361/698; 361/699; 361/704

(58) Field of Classification Search ............ 361/679.48–679.51, 690, 694–695, 361/679.46–679.47, 679.53–679.54, 696, 361/699, 702, 704; 454/184, 228–236
See application file for complete search history.

(56) References Cited

U.S. PATENT DOCUMENTS

| | | | |
|---|---|---|---|
| 3,691,432 A | 9/1972 | Edfors et al. | |
| 5,747,734 A * | 5/1998 | Kozlowski et al. | 174/50 |
| 6,414,845 B2 | 7/2002 | Bonet | |
| 6,976,911 B2 * | 12/2005 | Lanham et al. | 454/236 |
| 7,145,772 B2 * | 12/2006 | Fink | 361/695 |
| 7,251,135 B2 | 7/2007 | Crippen et al. | |
| 7,430,118 B1 | 9/2008 | Noteboom et al. | |
| 7,688,578 B2 * | 3/2010 | Mann et al. | 361/679.46 |
| 2003/0181158 A1 * | 9/2003 | Schell et al. | 454/229 |
| 2008/0232064 A1 * | 9/2008 | Sato et al. | 361/687 |
| 2008/0245083 A1 | 10/2008 | Tutunoglu et al. | |
| 2008/0266726 A1 | 10/2008 | Murakami et al. | |
| 2008/0270572 A1 | 10/2008 | Belady et al. | |
| 2009/0021907 A1 * | 1/2009 | Mann et al. | 361/686 |

OTHER PUBLICATIONS

"HP Modular Cooling System: water cooling technology for high-density server installations", Retrieved at <<http://h20000.www2.hp.com/bc/docs/support/SupportManual/c00600082/c00600082.pdf>>, Apr. 2007, Pages 15.

Kingston, West, "American Power Conversion Unveils InfraStruXure(R) InRow(TM) SC Cooling Unit for Wiring Closets and Server Rooms", Retrieved at <<http://www.prnewswire.com/cgi-bin/stories.pl?ACCT=104&STORY=/www/story/11-06-2006/0004467956&EDATE=>>, Dec. 8, 2008, Pages 2.

Miller, Rich, "Rackable Plans Air-Cooled Version of Container", Retrieved at <<http://www.datacenterknowledge.com/archives/2008/11/05/rackable-plans-air-cooled-version-of-container/>>, Nov. 5, 2008, Pages 7.

* cited by examiner

*Primary Examiner* — Robert J Hoffberg

(57) ABSTRACT

A modular server cooling unit user standard dimension modules to build a variety of components for use in cooling a server or server farm. One module may be the module in which the server(s) are mounted. Another module may be an exhaust plenum, drawing air through the server module and exhausting the air to the outside. A third module may be a cooling module through which outside air is drawn, filtered and optionally cooled, for example, using an adiabatic, or water-wash, cooler. Exhaust air may be selectively mixed with air from the cooling module to provide finer control of server temperature and humidity.

1 Claim, 8 Drawing Sheets

SELF-CONTAINED AND MODULAR AIR-COOLED CONTAINERIZED SERVER COOLING

BACKGROUND

Providing a controlled climate for computer servers and other sensitive equipment is traditionally accomplished by placing the servers in a room with climate controls and may include a raised floor, conditioned power, etc. Each server room has separate power cabling, duct work for conditioned and return air, filters, and airlocks, as required. Size and capacity changes to accommodate increased or reduced space or air conditioning needs are usually costly, if possible at all.

SUMMARY

One or more servers may be mounted inside a modular cooling environment that provides interchangeable cooling heads to accommodate different requirements. Each module may connect with other modules to provide humidity control, air recirculation, filtering, etc. Assembled modules may be stacked to accommodate additional servers/server racks. In some embodiments, different cooling modes may be exchanged to meet seasonal needs. For example, an adiabatic (swamp) cooler may be used in a desert climate in the most seasons, while a chilled water module may be used in the deep summer when high heat and humidity may require more temperature change than can be met using the adiabatic cooling module.

DETAILED DESCRIPTION

Although the following text sets forth a detailed description of numerous different embodiments, it should be understood that the legal scope of the description is defined by the words of the claims set forth at the end of this disclosure. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term by limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

Much of the inventive functionality and many of the inventive principles are best implemented with or in software programs or instructions and integrated circuits (ICs) such as application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore, in the interest of brevity and minimization of any risk of obscuring the principles and concepts in accordance to the present invention, further discussion of such software and ICs, if any, will be limited to the essentials with respect to the principles and concepts of the preferred embodiments.

Figure 1:
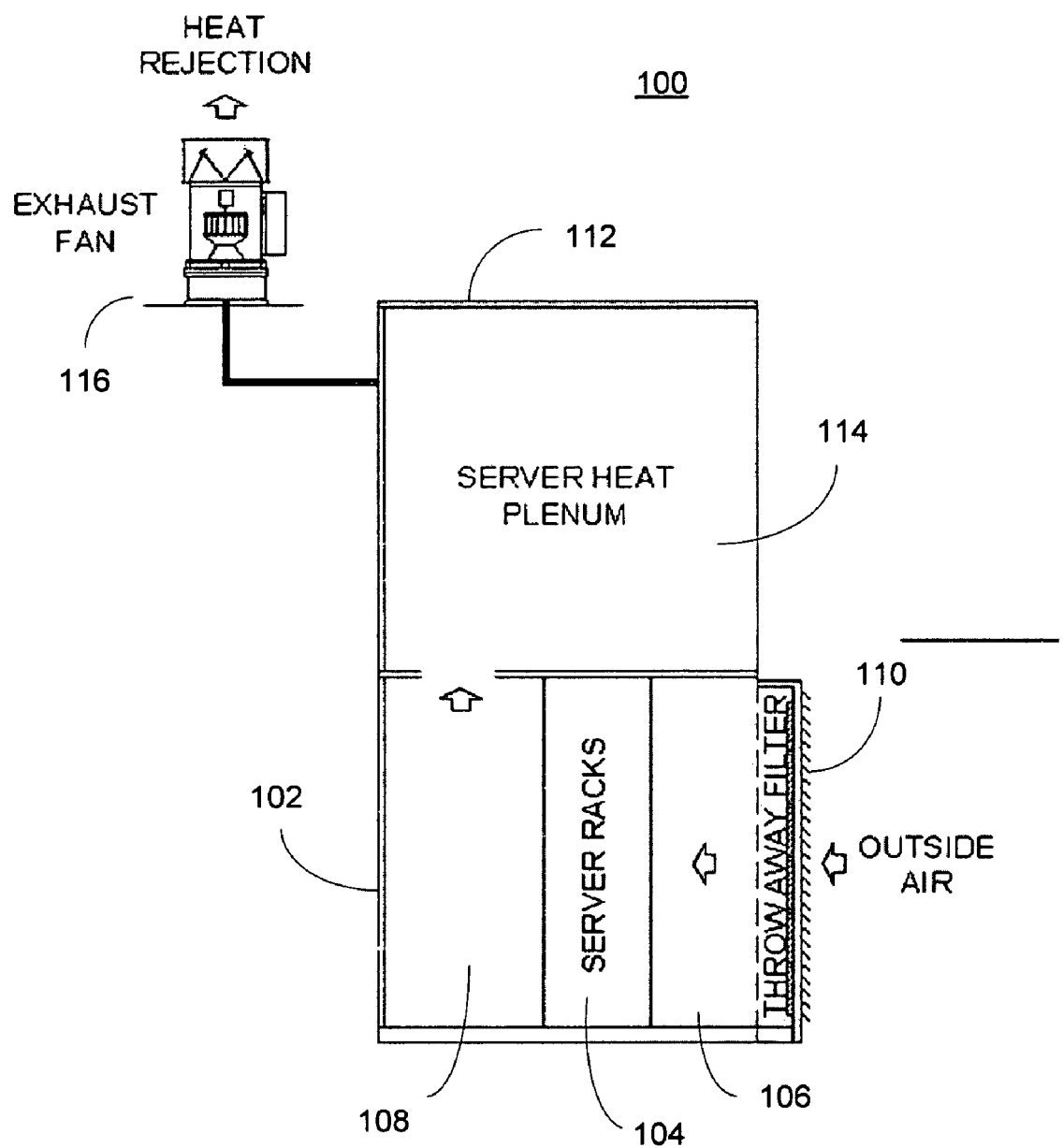
FIG. 1 is a block diagram of one embodiment of a modular server cooling system.

FIG. 1 illustrates a first embodiment of a modular server cooling unit 100. A first, server module 102 may be used to hold the servers 104 and may include a intake space 106, and an exit space 108. When minimal cooling is required, or if outside air is suitable for primary use, the outside air may be brought in through a filter 110. The filter 110 may be a simple disposable paper filter.

A second, plenum module 112 may be a simple large cavity 114 for drawing air from the exit space 108 of the server module 102. An exhaust fan 116 may be used to remove the exit air from the plenum module 112. As can be seen from the illustration, because each module has standard dimensions, they may be attached as needed, as further shown below.

Figure 2:
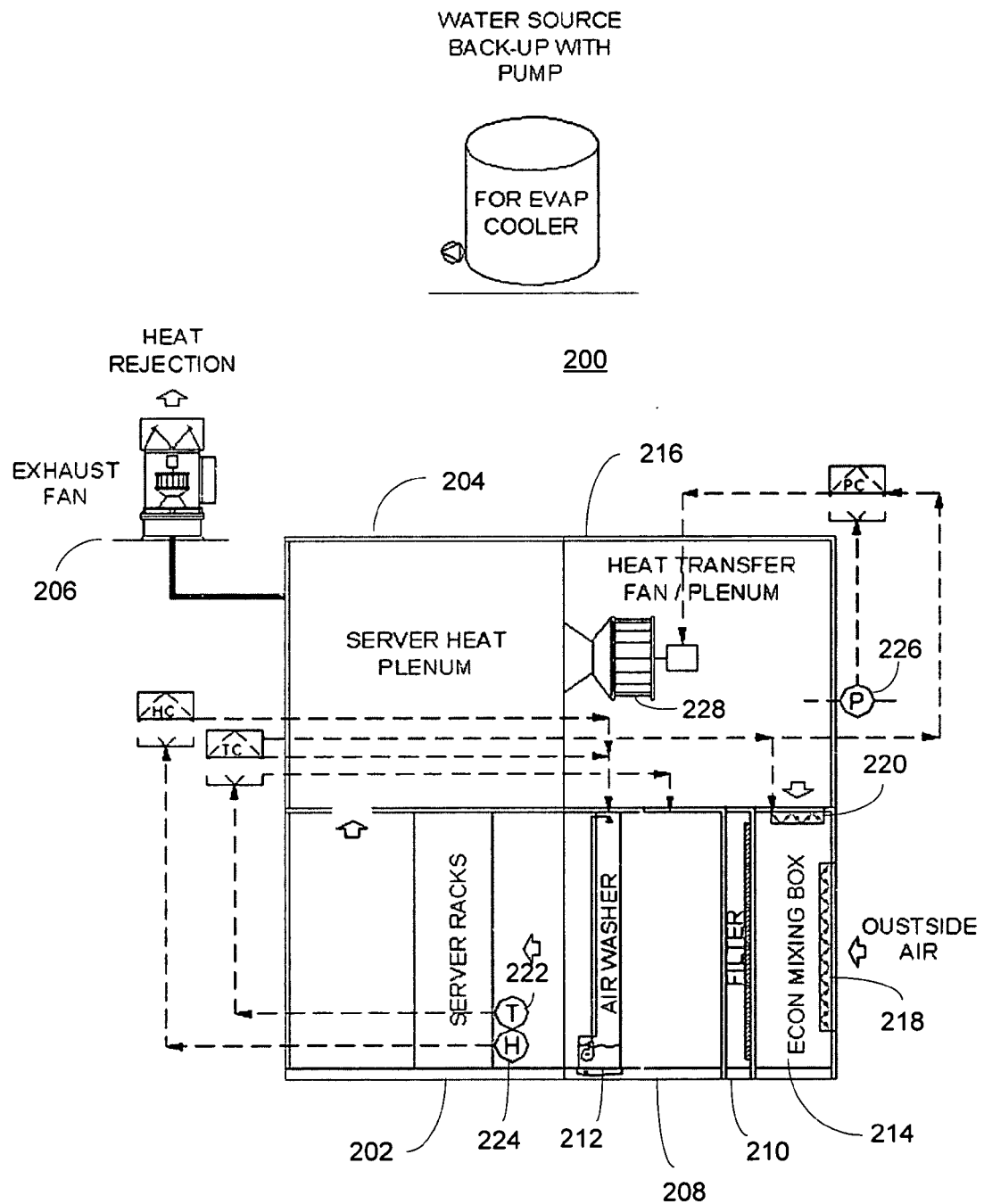
FIG. 2 is a block diagram of another embodiment of a modular server cooling system.

FIG. 2 illustrates another modular server cooling unit 200. In this embodiment, the server module 202 and a heat plenum module 204 may be the same as the corresponding modules from FIG. 1. In this embodiment, additional cooling may be required so instead of the simple filter 110 of FIG. 1, an entire cooling module 208 may be added. The cooling module 208 may include a filter 210, and an adiabatic cooler 212, that is, a porous filter through which water is dripped as air is drawn through the porous filter to cool the air. Such coolers are common in dry climates. The cooling module 208 may also include a mixing box 214 where warmed air may be recirculated, for example, when the inlet air temperature is too low.

A heat transfer module 216 may be used to facilitate the recirculation of air from the heat plenum module 204 to the cooling module 208. A damper 218 may be used to control outside air flow into the cooling module 208 and another damper 220 may be used to mix recirculated air into the mixing box 214.

In operation, outside air may be drawn into the mixing box 214, may be filtered at filter 210 and cooled and humidified at adiabatic cooler 212. The heat plenum module 204 may draw air from the server module 202 either by means of the exhaust fan 206 or by drawing air into the heat transfer module 216 and mixing the air into the cooling module 208. A number of sensors 222, 224, 226 may sense temperature, humidity and pressure, respectively for use in controlling dampers 218 and 220 and the speed of fans 206 and 228 for managing air flow, temperature and humidity.

Figure 3:
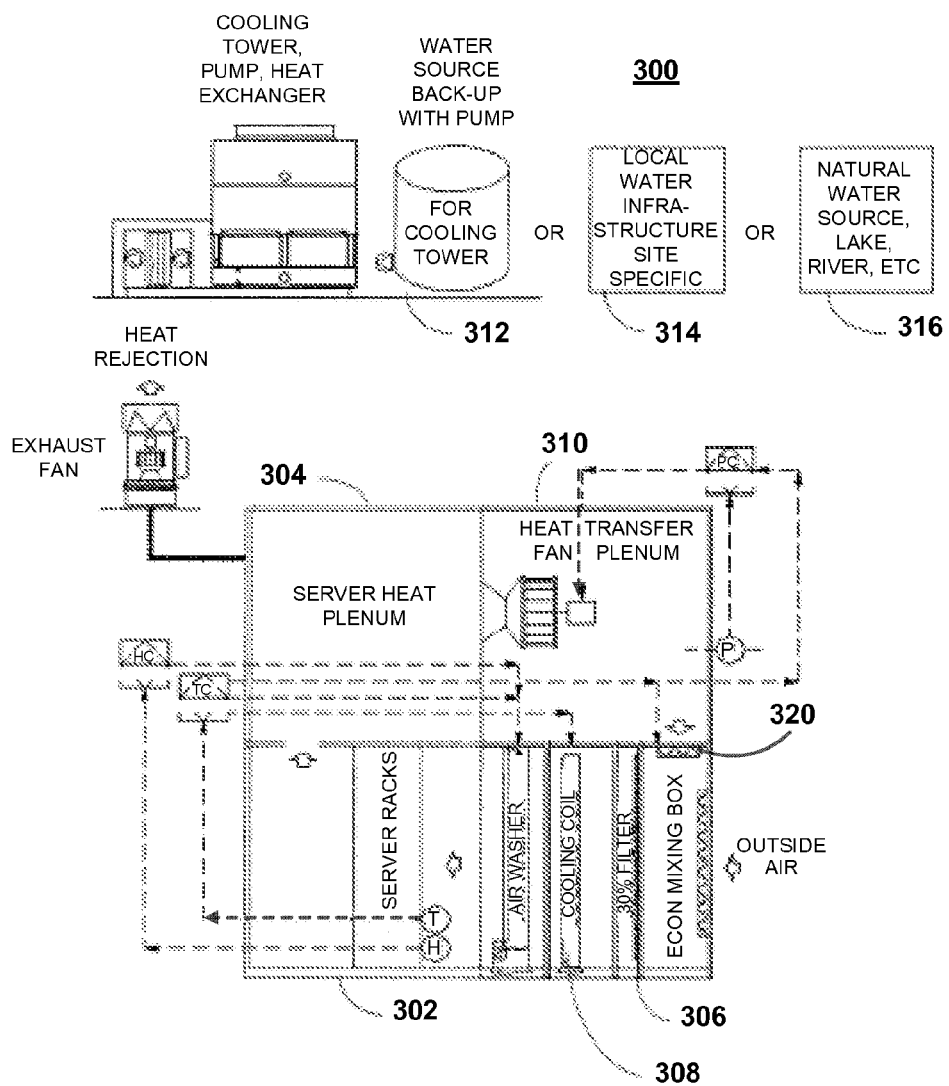
FIG. 3 is a block diagram of yet another embodiment of a modular server cooling system.

FIG. 3 illustrates another embodiment of a modular server cooling unit 300. In this embodiment, the server module 302, a heat plenum module 304, a cooling module 308 and a heat transfer module 310 may operate as described above with respect to FIG. 2. Cooling coils 308 may be added to the cooling module 306 to provide more aggressive cooling than may be available with the simple adiabatic cooler 212 of FIG. 2. For example, the cooling coils 308 may be coupled to an external cooling tower 312, local water infrastructure 314, or a natural water source 316 to provide additional cooling, as required. Temperature and humidity sensors may allow a transition from adiabatic cooling to traditional air conditioning as required to meet heat and humidity requirements in the server module 302. Damper 320 may be used to return air to the cooling module 306.

Figure 4:
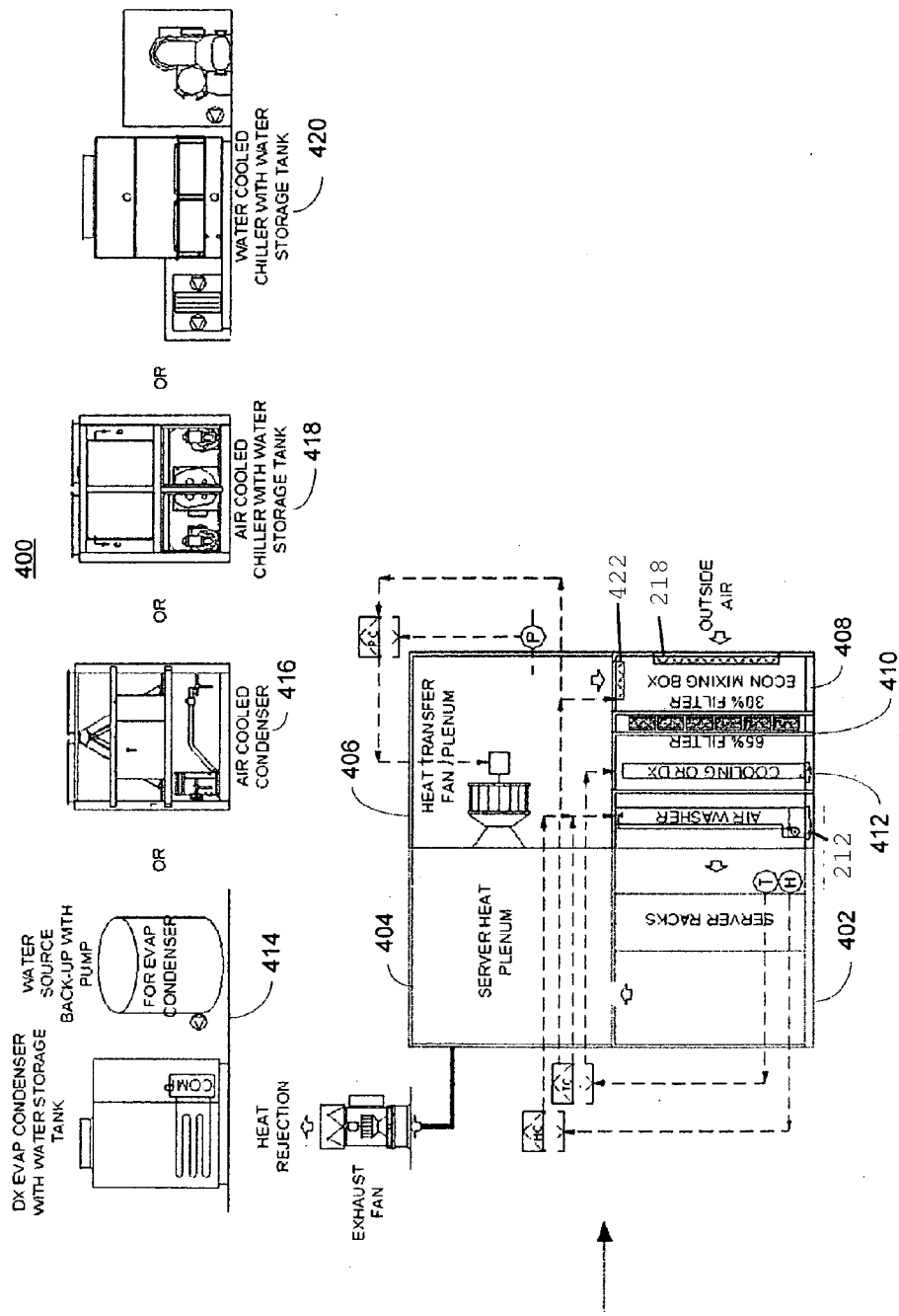
FIG. 4 is a block diagram of a fourth embodiment of a modular server cooling system.

FIG. 4 illustrates another embodiment of a modular server cooling unit 400. In this embodiment, the server module 402, a heat plenum module 404, a cooling module 408 and a heat transfer module 406 may operate as described above with respect to FIGS. 2 and 3. The cooling coils 308 may be supplemented or replaced by cooling coils 412, providing higher capacity cooling than is available from the chilled or natural water sources FIG. 3. A variety of known cooling techniques may be used to provide this additional cooling, for example, a DX evaporative condenser 414, an air cooled condenser 416, an air cooled chiller 418, or a water cooled chiller 420. Other techniques may also be used to provide cooling in association with the cooling coils 412. To provide a higher quality server environment, one or more filters 410 may be used to purify the air. Damper 422 may be used to return air to the cooling module 408.

Figure 5:
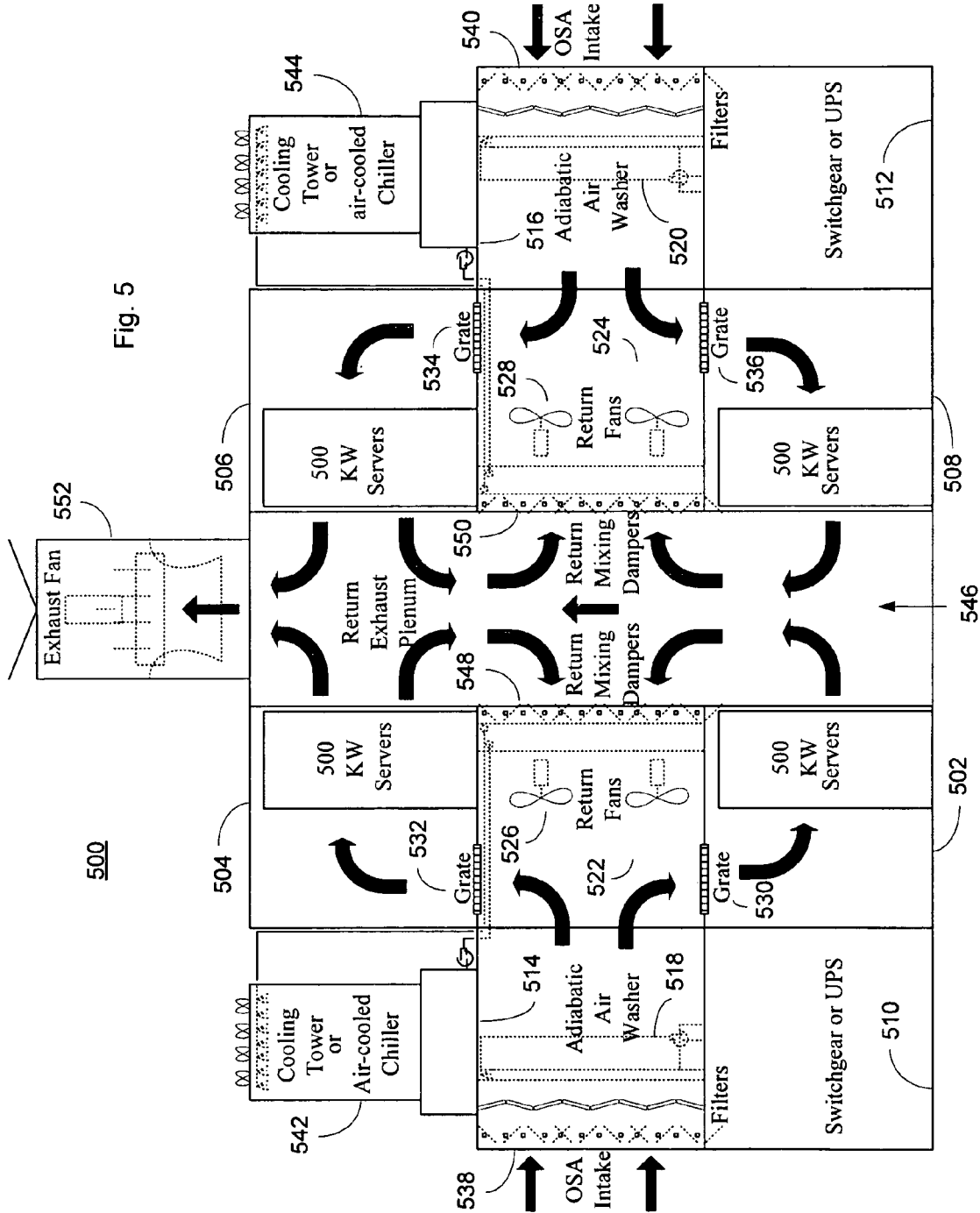
FIG. 5 is a block diagram of a fifth embodiment of a modular server cooling system.

FIG. 5 is another embodiment of a modular server cooling unit 500. In this embodiment, four server modules 502, 504, 506, and 508 are accommodated. Modular power units 510 and 512 may couple power from an outside source (not depicted) to the server modules 502, 504, 506, 508. Cooling modules 514 and 516 may include adiabatic coolers 518 and 520, respectively. Heat transfer modules 522 and 524 provide a path for cooled air to travel from the cooling modules 514 and 516 through respective adjustable grates 530, 532, 534, and 536 and through each server module. A return exhaust plenum 546 draws air through the server modules 502, 504, 506 and 508. An exhaust fan 552 may be used to remove the exhaust air. Return fans 526 and 528 may draw air from the return exhaust plenum 546 through adjustable dampers 548 and 550. In one embodiment, air from the exhaust plenum 546 may be cooled by cooling coils 525 and 527. To adjust the mix of input and return air, intake dampers 538 and 540 may be used in combination with the adjustable dampers 548 and 550. Coolers 542 and 544, similar to any of the cooling mechanisms described above may be used in conjunction with cooling coils 525 and 527 to provide cooling to the cooling unit 500.

Figure 6:
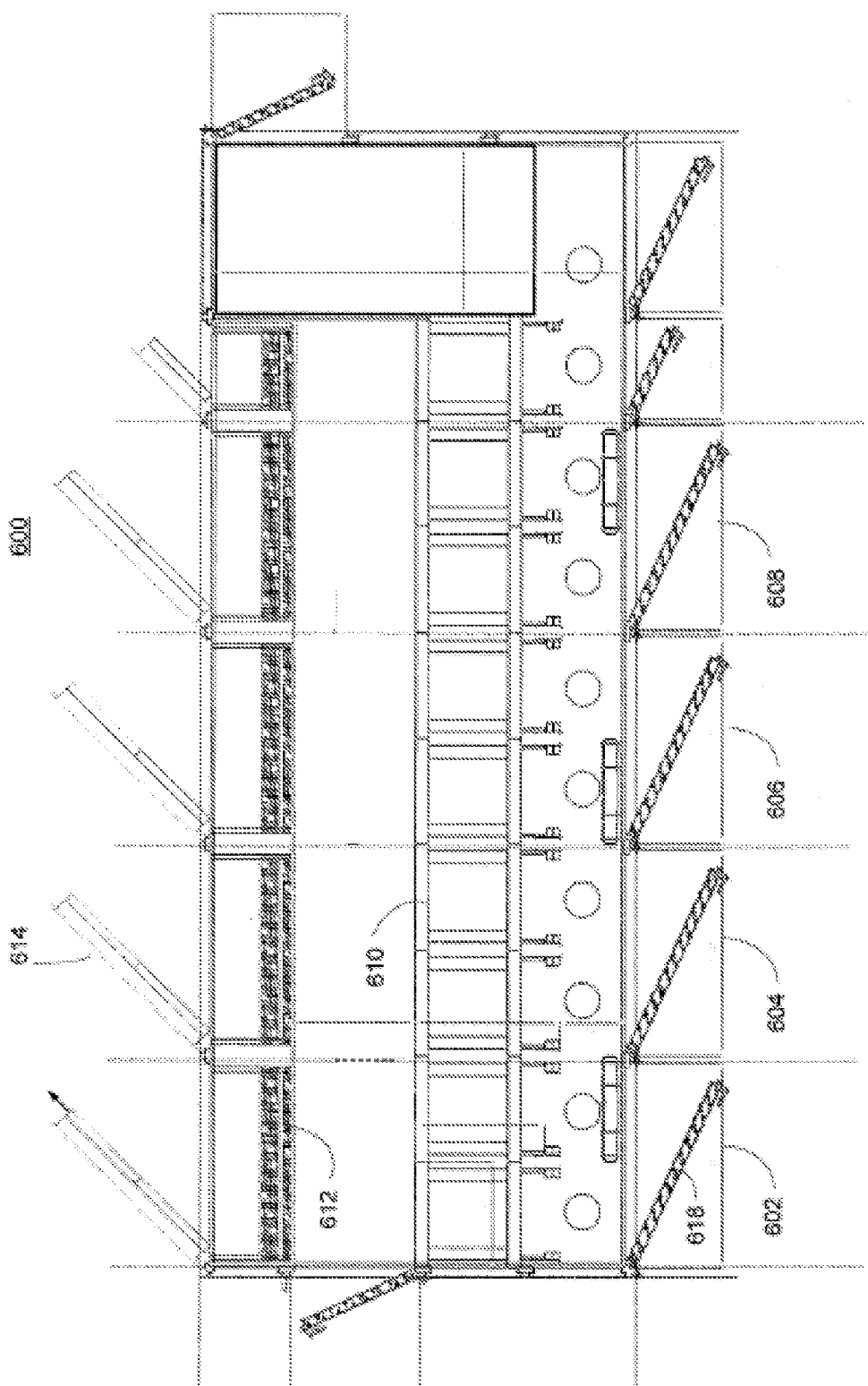
FIG. 6 is a top view diagram of a mechanical drawing of a modular server cooling system.

FIG. 6 illustrates a top view of an embodiment of a modular cooling unit 600, illustrating side-by-side expansion. Each bay 602, 604, 606, and 608 may contain one or more server modules 610, and an adiabatic cooler 612. Exemplary doors 614 and 618 may be opened to provide access to filters and servers. Access to other areas of the cooling unit 600 may be provided by additional access doors as shown. If each bay is considered to define a plane, bays may be expanded perpendicularly to the plane.

Figure 7:
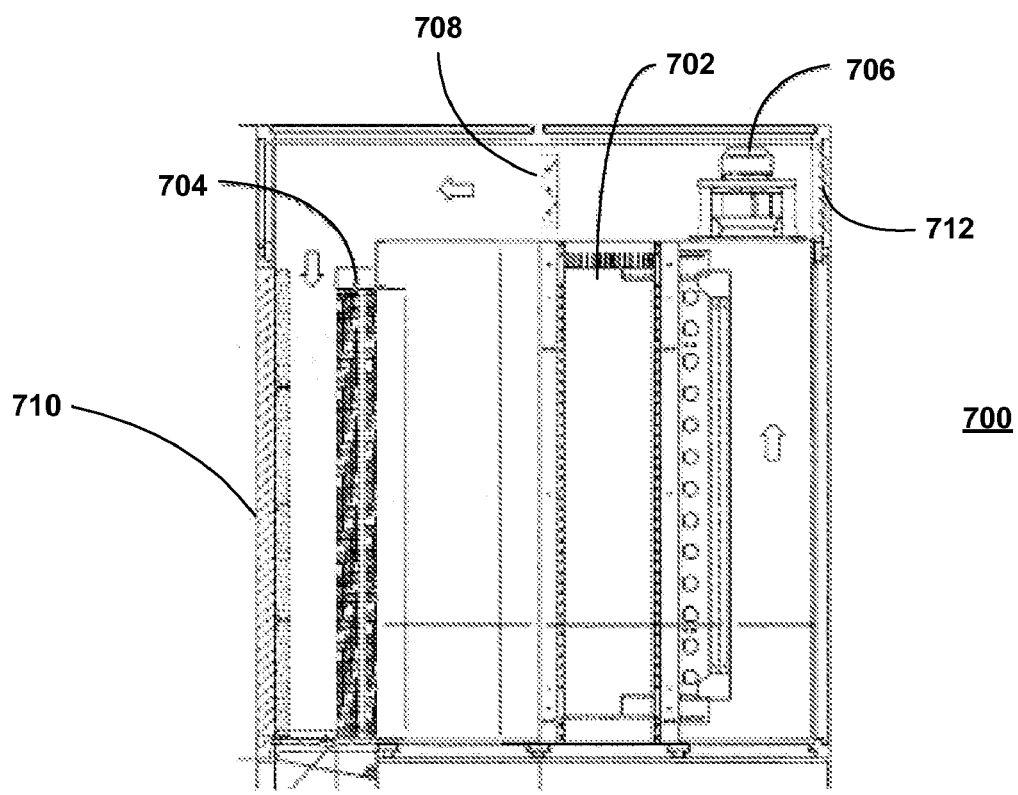
FIG. 7 is a side view diagram of the mechanical drawing of FIG. 6.

FIG. 7 illustrates a side view 700 of the modular cooling unit 600. FIG. 7 illustrates the server module 702, the adiabatic cooler module 704, and an exhaust fan 706. An adjustable damper 708 allows controlled mixing of exhaust air with inlet air. A filter 710 may provide a first level of air filtering before the adiabatic cooler module 704. An exhaust damper 710 may vent at least a portion of the air flowing from the exhaust fan out of the system.

Figure 8:
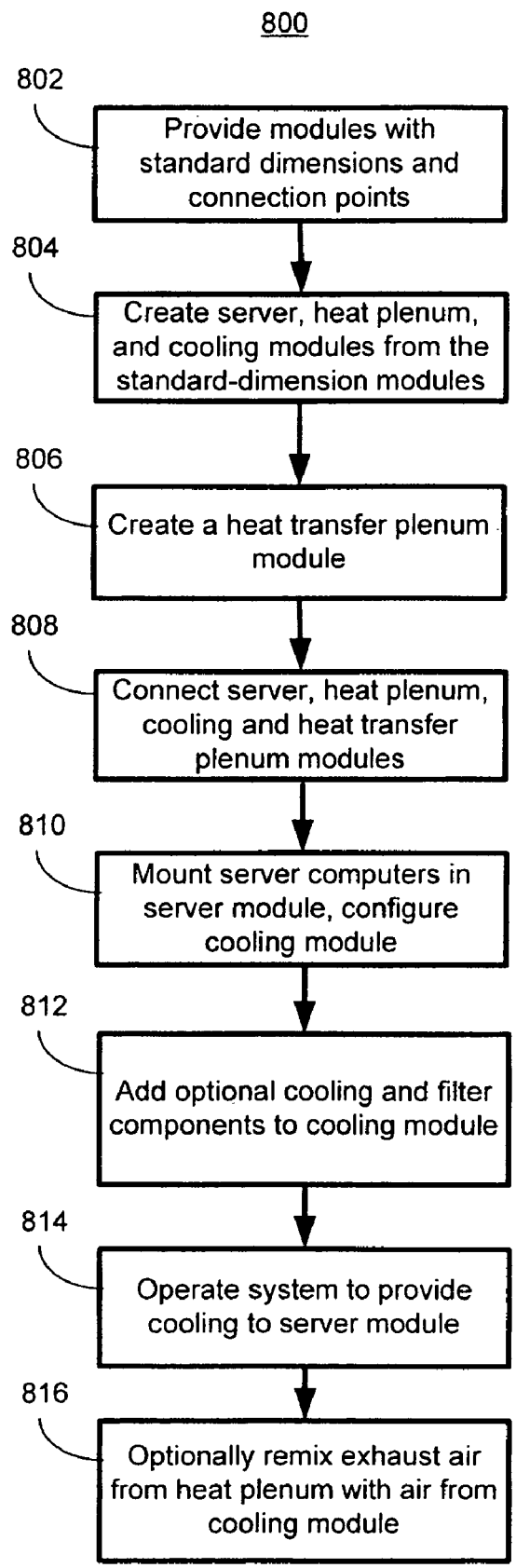
FIG. 8 is a flow chart of a method of cooling a server using a modular server cooling system.

FIG. 8 is a flow chart of a method 800 for providing a modular cooling unit, such as the modular cooling unit 400 of FIG. 4. At block 802, a plurality of common-sized modules may be provided. The modules may be uniform in size or may be constructed on a standard grid, such as a one half or a one quarter grid, allowing, for example, doubling the number of units in a module space. Commonly dimensioned mounting points may allow easy mechanical connections both module-to-module and module-to-building/floor.

At block 804, common-sized modules may be adapted to provide a server module 402, with server mounting hardware (not depicted), such as a standard rack mount or blade mount chassis, a heat plenum module 404 with inlet and exhaust vent points, and a cooling module 410 with one or more filtering and cooling inserts, such as an adiabatic cooler, cooling coil, filter, or all of these.

At block 806, in some embodiments a heat transfer plenum module 406 may be provided to selectively (controllably) return exhaust air to the cooling module to allow adjustment of temperature and humidity. In some embodiments, air to or from the cooling module may be adjusted as part of the exhaust air mixing process.

At block 808, the server 402, heat plenum 404, heat transfer 406 (if used) and cooling module 410 may be mechanically and electrically attached to each other as required. The components may be removably attached, e.g., bolted or clipped together, to allow easy maintenance and upgrade. An optional power module, e.g. module 510 of FIG. 5 may be used to condition and supply power to the server module 402 and other modules as required. Standardized power connection points may be used to accommodate wiring between those modules requiring power connections. When power requirements cannot be determined, or may vary over time, for example, in a server module, channels may be provided to allow different gauge wires or busses to be routed as needed.

At block 810, server computers (not depicted) may be mounted in the server module 402.

At block 812, the cooling module 410 may be configured as needed and as described above, to include elements from a simple filter to an adiabatic cooler to cooling coils connected to an external condenser or water chilled cooler.

At block 814, the system 400 may be operated, so that outside air may be circulated through the cooling module 410, through the server module 402 and into the heat plenum 404. At the heat plenum 404, the air may exhausted to the outside.

At block 816, air from the heat plenum 404 may be returned to the server module 402 via the heat transfer plenum 406.

Although the foregoing text sets forth a detailed description of numerous different embodiments of the invention, it should be understood that the scope of the invention is defined by the words of the claims set forth at the end of this patent. The detailed description is to be construed as exemplary only and does not describe every possibly embodiment of the invention because describing every possible embodiment would be impractical, if not impossible. Numerous alternative embodiments could be implemented, using either current technology or technology developed after the filing date of this patent, which would still fall within the scope of the claims defining the invention.

Thus, many modifications and variations may be made in the techniques and structures described and illustrated herein without departing from the spirit and scope of the present invention. Accordingly, it should be understood that the methods and apparatus described herein are illustrative only and are not limiting upon the scope of the invention.

We claim:

1. system providing cooling for one or more computer servers comprising:
    a plurality of uniformly-sized modules, each of the plurality of uniformly-sized modules adapted to a particular function in the system, including:
        a server module adapted to receive one or more computer servers;
        a heat plenum module directly coupled to the server module;
        a heat transfer plenum module directly coupled to the heat plenum module, the heat transfer plenum module including a fan that draws air through the heat plenum module, the server module and a cooling module; and
        the cooling module with an adiabatic cooler and an air filter, the cooling module directly coupled to the server module and directly coupled to the heat transfer plenum module, the cooling module including a first damper that returns a portion of the air in the heat transfer plenum module to the cooling module, the cooling module adapted to accept outside air through a second damper and to accept recirculated air via the first damper.

* * * * *